United States Patent [19]

Verstegen et al.

[11] Patent Number: 5,386,584
[45] Date of Patent: Jan. 31, 1995

[54] INTERRUPT-GENERATING KEYBOARD SCANNER USING AN IMAGE RAM

[75] Inventors: Brian Verstegen, Sunnyvale; Lance King, Newark; George A. Vlantis, Sunnyvale, all of Calif.

[73] Assignee: Chips and Technologies, Inc., San Jose, Calif.

[21] Appl. No.: 132,125

[22] Filed: Oct. 5, 1993

Related U.S. Application Data

[63] Continuation of Ser. No. 537,583, Jun. 14, 1990, abandoned.

[51] Int. Cl.6 .................................................. G06F 3/02
[52] U.S. Cl. ..................................... 391/800; 364/234; 364/928.6
[58] Field of Search ................. 395/275, 425, 775, 800

[56] References Cited

U.S. PATENT DOCUMENTS

| | | | |
|---|---|---|---|
| 3,792,466 | 2/1974 | Arnold et al. | 340/365 E |
| 3,941,989 | 3/1976 | McLaughlin | 364/900 |
| 4,279,020 | 7/1981 | Christian | 364/900 |
| 4,357,849 | 11/1982 | Ezawa | 84/1.01 |
| 4,615,005 | 9/1986 | Maejima | 364/707 |
| 4,701,748 | 10/1987 | Ushiki | 364/707 |
| 4,825,143 | 4/1989 | Cheng | 364/707 |
| 4,922,448 | 5/1990 | Kunieda | 364/707 |
| 4,945,504 | 7/1990 | Nakama | 364/709.11 |

*Primary Examiner*—David Y. Eng
*Attorney, Agent, or Firm*—Benman Collins & Sawyer

[57] ABSTRACT

A system for assisting the scanning of a keyboard associated with a personal computer. The system comprises a logic circuit which interacts with the microcontroller and the keyboard to reduce power consumption by the personal computer as well as freeing the microcontroller to do other tasks. The logic circuit "interrupts" the microcontroller whenever keyboard activity is detected. An image RAM stores a pattern of current key closures to be compared in subsequent keyboard scans. A subsequent miscompare between the keyboard and the Image RAM indicates that keyboard activity has occurred. When no keys are pressed, scanning may be stopped. Any key closure will then generate an interrupt, and the microcontroller will restart scanning.

5 Claims, 7 Drawing Sheets

INTERRUPT-GENERATING KEYBOARD SCANNER USING AN IMAGE RAM

This is a continuation of copending application Ser. No. 07/537,583 filed on Jun. 14, 1990, now abandoned.

FIELD OF THE INVENTION

The present invention is directed toward an apparatus for monitoring the keyboard matrix of a personal computer, and, more particularly, to a hardware module for scanning the keyboard matrix.

BACKGROUND OF THE INVENTION

In a personal computer the keyboard associated with the computer is scanned periodically to ensure that the activation of the keys initiate some action. Typically, a microcontroller that is within the computer will, under program control, scan the keyboard matrix on a periodic basis to ensure that the computer acts properly when a key is struck.

The scanning function requires a significant amount of the microcontroller's processing bandwidth that could be used for other tasks. In addition, utilizing the microcontroller to perform this function will require that a certain amount of power be consumed by the personal computer. In certain instances this power consumption may significantly decrease the operating time of battery operated portable computers.

As personal computers become more and more compact, and particularly with the advent of portable computers, such as the laptop or notebook type computers, it is important to provide schemes that reduce the power consumed by the personal computer. In addition, as computers become smaller, it is more and more important that all the precious processing bandwidth of the microcontroller be utilized efficiently.

In the laptop or notebook computer environment, the same microcontroller which does the keyboard scanning might also perform other functions. If this microcontroller performs the scanning strictly under program control, without the benefit of a hardware keyboard scanner, there can be a significant performance penalty.

Another problem encountered in previously known keyboard scanning systems is what is known as "ghost" key closures of the keyboard. What is meant by ghost key closures is when several key switches on the keyboard are activated, there is another "closed circuit" on the matrix even though the associated key switch is not depressed. This problem is typically solved by providing additional circuitry within the keyboard. However, in the portable computer environment this additional circuitry can be expensive and can also unfavorably contribute power consumption.

What is needed to use with a personal computer is a system which will scan the keyboard and minimize the use of the microcontroller that is in a personal computer. What is further needed is a keyboard scanning technique that will minimize the power consumption in a personal computer. This system should not only satisfy the above requirements but should be simple and easy to use with a personal computer, a portable computer such as a laptop or notebook type.

SUMMARY OF THE INVENTION

A logic circuit is disclosed that assists the microcontroller in the keyboard scanning function. The logic circuit will use significantly less power than the microcontroller and in addition will allow the microcontroller to use its processing capability to perform other functions.

The present invention provides for, in combination with a personal computer, the personal computer including a microcontroller and a keyboard including a plurality of key switches, the keyboard further including a plurality of intersecting strobe lines and sense lines, a key closure being made when the appropriate strobe and sense lines are connected together by a particular key switch, a hardware assisted keyboard scanner.

The hardware assisted keyboard scanner comprises a random access memory (RAM), the RAM being organized as a plurality of bytes of data and plurality of addresses, each of the plurality of bytes of data corresponding to one of the plurality of sense lines and each of the plurality of addresses corresponding to one strobe line, a counter for providing an address to the RAM, the counter also for sequentially asserting each of the strobe lines; a comparator for comparing the data bytes from the RAM to the corresponding sense lines to determine if there has been a change in any of the key switches of the keyboard; and a flip flop for providing an interrupt signal to the microcontroller when there is a change in any of the key switches of the keyboard.

Through the use of the present invention the overall performance of the personal computer is improved. In addition, the power consumed in a personal computer can be significantly reduced. The present invention will find significant utility in the portable personal computer environment.

DETAILED DESCRIPTION

The present invention relates to an improvement in the scanning of a keyboard matrix associated with a personal computer. The following description is presented to enable one of ordinary skill in the art to make and use the invention and is provided in the context of a particular application and its requirements.

Various modifications to the preferred embodiment will be readily apparent to those skilled in the art and the generic principles defined herein may be applied to other embodiments. Thus, the present invention is not intended to be limited to the embodiment shown but is to be accorded the widest scope consistent with the principles and novel feature disclosed herein.

Figure 1:
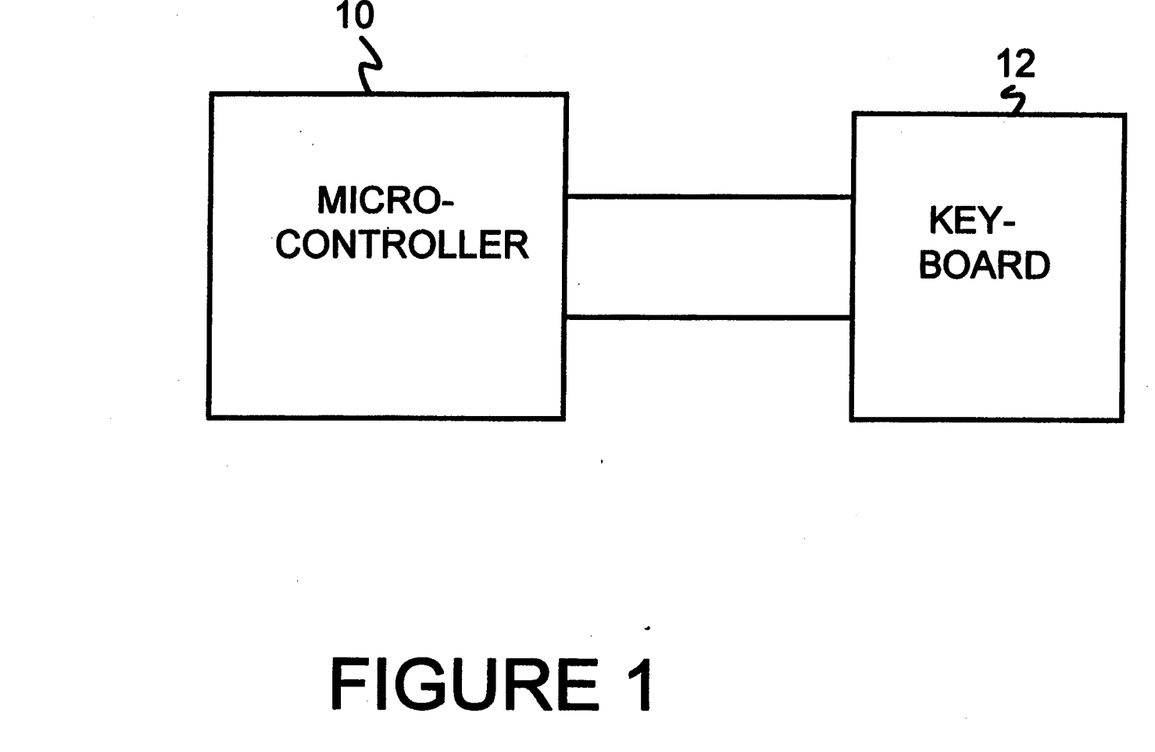
FIG. 1 is a block diagram of a prior art keyboard scanning system.

Referring now to FIG. 1, what is shown is a microcontroller 10 coupled to the keyboard 12. In general, in previously known systems, the microcontroller 10 sequentially drives each strobe line active while monitoring the sense lines for data pattern changes. These data pattern changes would indicate keyboard activity. To more fully understand the operation of the microcontroller 10 when scanning the keyboard 12 refer now to FIG. 2.

Figure 2:
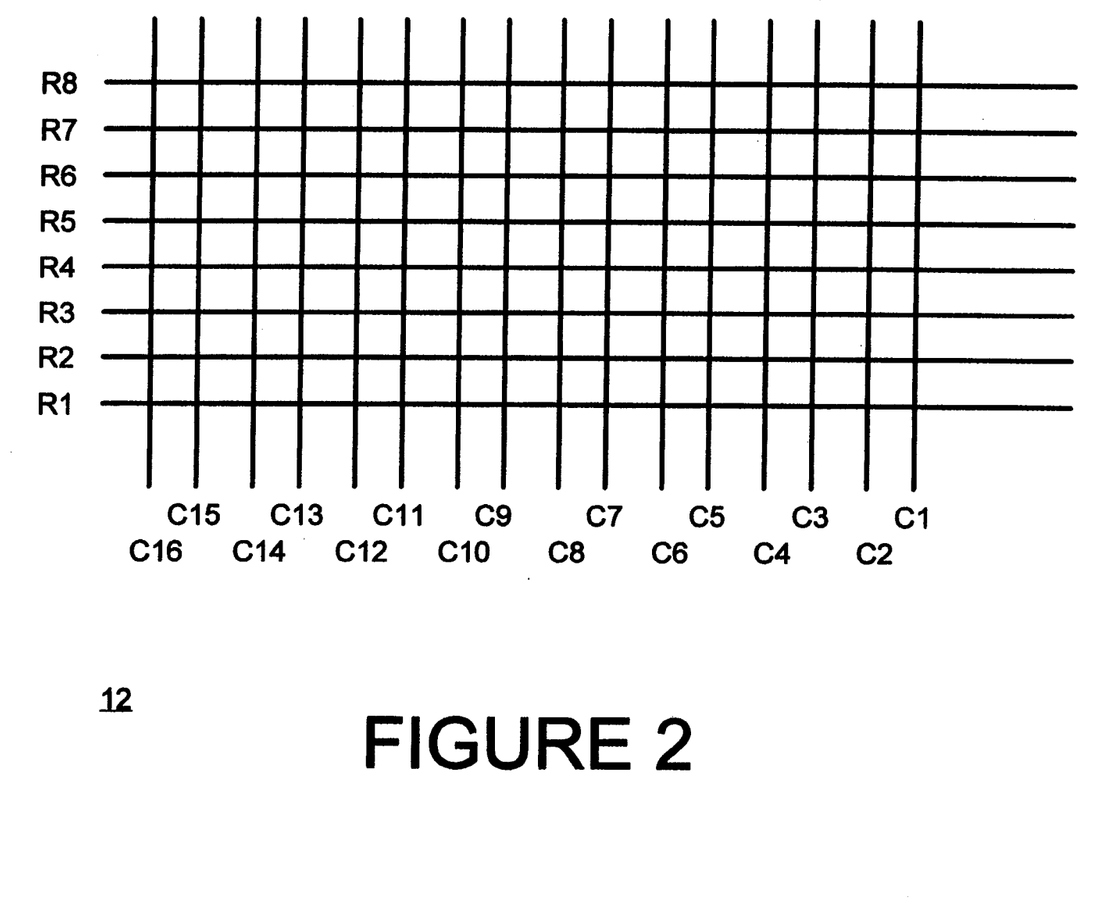
FIG. 2 is a block diagram of a typical keyboard matrix utilized with a personal computer.

FIG. 2 is a diagrammatic representation of the keyboard matrix of the keyboard 12. The keyboard matrix of this embodiment comprises a plurality of intersecting conducting wires arranged in columns (C1–C16) and rows (R1–R8). The columns wires are called the strobe lines in this specification. The row wires are called the sense lines in this specification. It should be recognized by one of ordinary skill in the art that there can be any number of sense lines and strobe lines and still be within the spirit and scope of the prevent invention.

In a typical keyboard, a key switch (not shown) is placed at each intersection of a row wire and column wire. The strobe (column) lines and sense (row) lines allow for the scanning of the keyboard matrix to determine when key switch make/break activity occurs. In one embodiment the strobe lines may be driven either individually or as a group, and the sense lines may be pulled high with resistors in this type of keyboard matrix. When no key switch make/break activity is present, the sense lines are all high, regardless of which strobe line is driven active. When key switch make/break activity exists, then at least one of the sense lines will be low, dependent upon the strobe line that is asserted.

Referring back to FIG. 1, the microcontroller 10 along with its other duties (which are not shown in this figure) has to monitor the keyboard 12 for key switch activation. Hence the microcontroller must sequentially drive each strobe line active while monitoring the sense lines for data pattern changes indicating keyboard activity.

One problem encountered in the previously known keyboard scanning system of FIG. 1 is the problem of "ghost" key switch closures. To more fully describe this problem, refer now to FIGS. 3 and 4.

Figure 3:
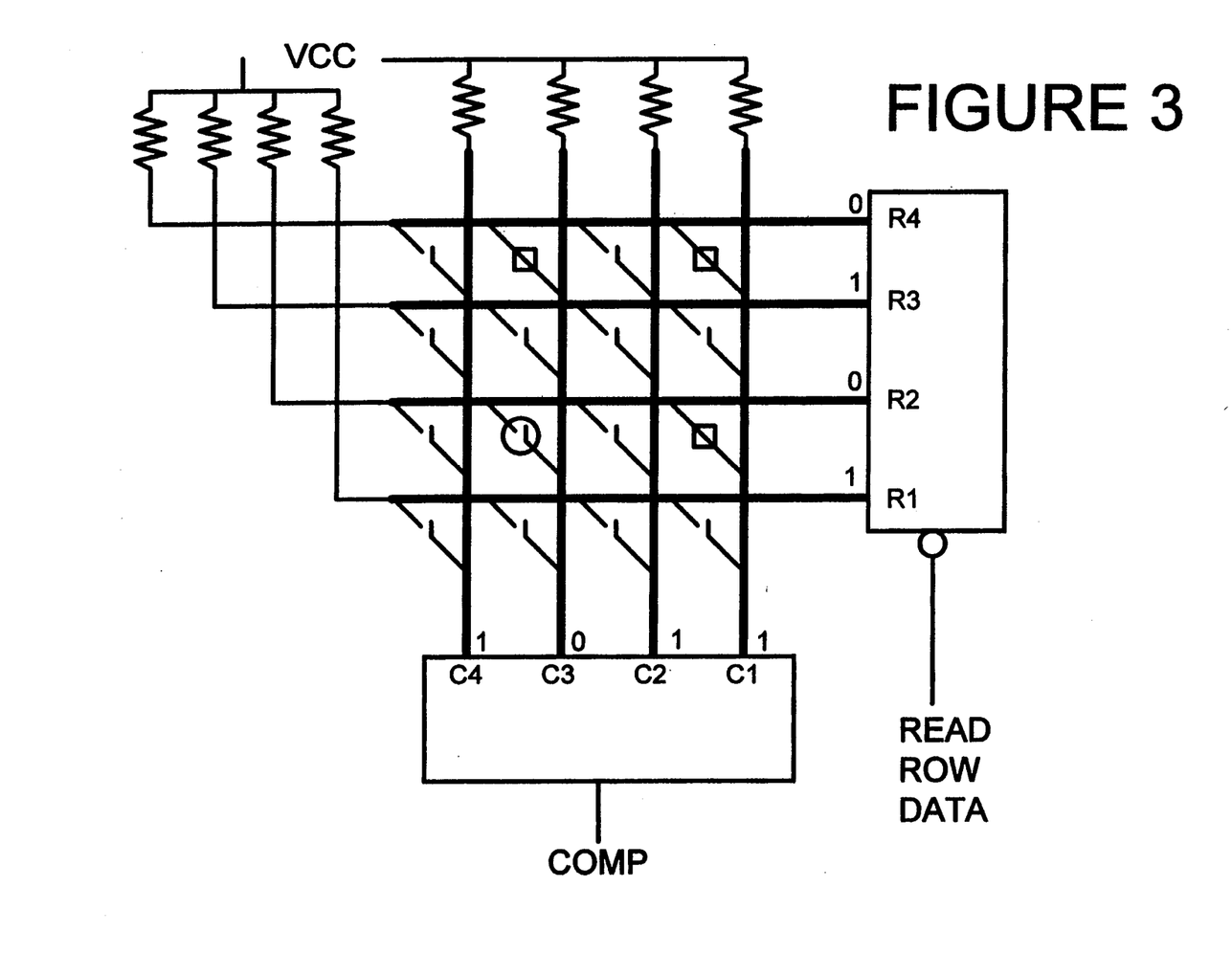
FIG. 3 is a schematic representation of a portion of a first prior art keyboard matrix.

FIG. 3 is a simplified diagram of a portion of a typical keyboard matrix. In this embodiment, there are four sense (R1–R4) signals and four strobe (C1–C4) signals. Key switches 30 connect respective rows of strobe (C1–C4) and sense (R1–R4) signals when closed. The boxes shown in the Figure indicate an activated key switch 30. In this embodiment, as is shown, there are key switch 30 closures between R1 and C3, between R1 and C1 and between R3 and C1.

Generally, "ghost" closures occur due to three or more key switch closures occurring simultaneously on the keyboard 12. The "ghost" closure indicated by the circle at R3 and C3 is caused by the key switch closures at R3 and C1, R1 and C1, and R1 and C3. The closure at R3 and C3 is detected even though the key switch 30 is not pressed. Hence, when strobe C3 is asserted, the row data pattern is 1010. This type of keyboard matrix does not have the ability to distinguish between the ghost closures and real key switch 30 closures.

Figure 4:
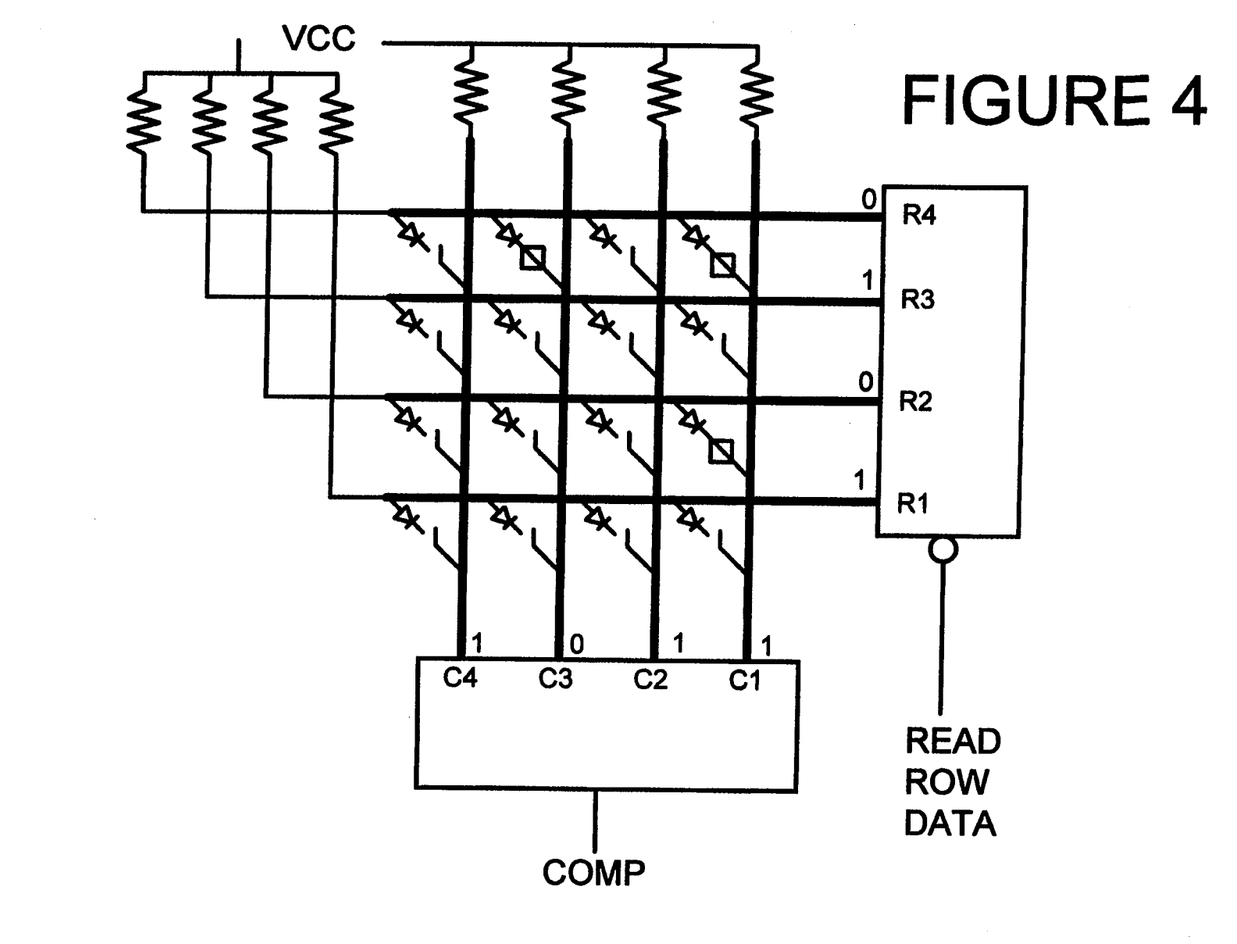
FIG. 4 is a schematic representation of a portion of a second prior art keyboard matrix.

There have been previously known systems for eliminating this problem. One method to eliminate the "ghosting" problem is shown in FIG. 4. FIG. 4 is identical to FIG. 3 except that each key switch 30 has a diode circuit 32 attached in series. These diode circuits prohibit continuity from one column to another column, thereby avoiding "ghost" key closures. Hence, when strobe C3 is asserted, C1 remains diode isolated and the row data pattern is 1110.

Although the use of a diode or the like in a keyboard matrix is effective in preventing ghost closures, in a portable computer environment it is more desirable to provide a keyboard matrix that does not include additional complexity and thereby additional cost. In addition, the use of diode circuits, or the like, adds to the overall complexity of keyboard matrix and hence personal computer.

There are at least two other problems with the microcontroller performing the keyboard scanning function without any assistance.

Firstly, the microcontroller 10 consumes a large amount of power. For example, the current drawn by a microcontroller 10 while performing this function can be as high as 30 mA. The overall power consumption in a personal computer becomes a significant factor when the computer is a laptop or notebook type personal computer because power conservation is critical to the total cost of the computer.

Secondly, when the microcontroller 10 is performing the keyboard scanning, as is well known, it cannot perform any other operation. The microcontroller 10 can require as much as 5 Ms to scan every key switch on the keyboard 12. As has been before mentioned, this function requires processing bandwidth of the microcontroller 10 that could be used for other tasks.

Hence, particularly in the portable computer environment, it becomes more important to be able to minimize the use of power when no tasks are being done by the microcontroller 10 and it is also important to free the microcontroller 10 to perform as many functions as possible. Accordingly, the present invention provides a solution to these problems through the use of a logic circuit to assist the microcontroller with the keyboard scanning function.

Figure 5:
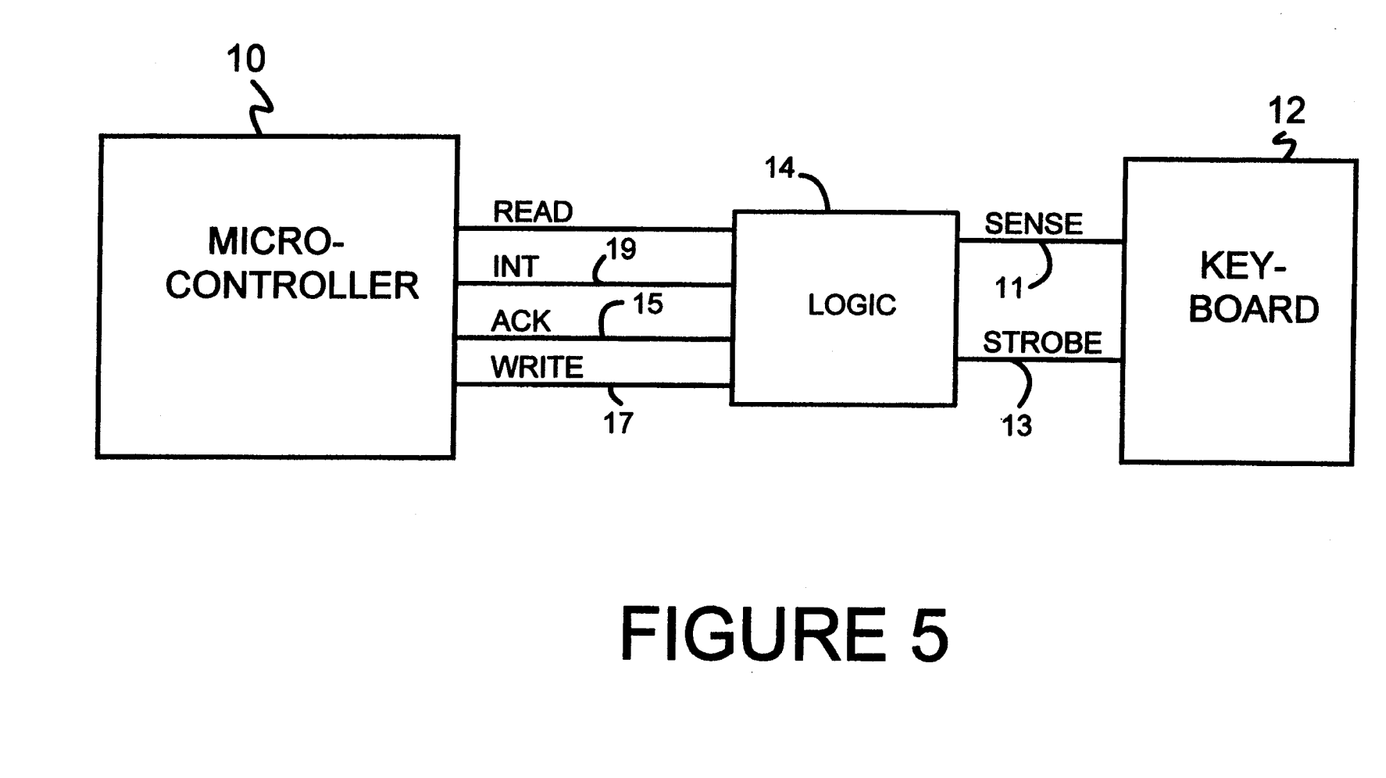
FIG. 5 is a simplified block diagram of the hardware assisted keyboard scanning system of the present invention.

Referring now to FIG. 5, what is shown is a logic circuit 14 coupled between the microcontroller 10 and the keyboard 12. As is seen, the logic circuit 14 receives the sense signals via line 11 from the keyboard 12 and provides a strobe signal to the keyboard 12 via line 13 and outputs to the microcontroller 10 at appropriate times, an interrupt signal via line 15. Furthermore, the microcontroller 10 updates RAM 24 in logic circuit 14 via lines 17 and also provides an acknowledge signal to the logic circuit 14 via line 19 to allow the logic circuit 14 to continue to function.

The use of the logic circuit 14 addresses two major concerns with the previously known microcontroller keyboard scanning system shown in FIG. 1. Firstly, the logic circuit 14 can be constructed from CMOS technology which uses significantly less power than the CMOS microcontroller 10 which it replaces. For example, the logic circuit 14, when properly fabricated, can draw current in the 500 uA range.

Hence, logic circuit 14 will consume an order of magnitude less power than the typical microcontroller 10 which, as before mentioned, draws current in the mA range when performing the keyboard scanning function. During times when the keyboard scanning function is occurring, the microcontroller 10 can enter a power down mode of operation until interrupted by the logic circuit 14.

In addition, through the use of the logic circuit 14, the keyboard scanning function can be totally interrupt driven. That is, the microcontroller 10 can perform other functions while the logic circuit 14 is scanning the keyboard 12. When a key switch closure is detected on the keyboard 12 by the logic circuit 14 an interrupt signal is provided by logic circuit 14 which will cause the microcontroller 10 to respond to the keyboard activity.

Figure 6:
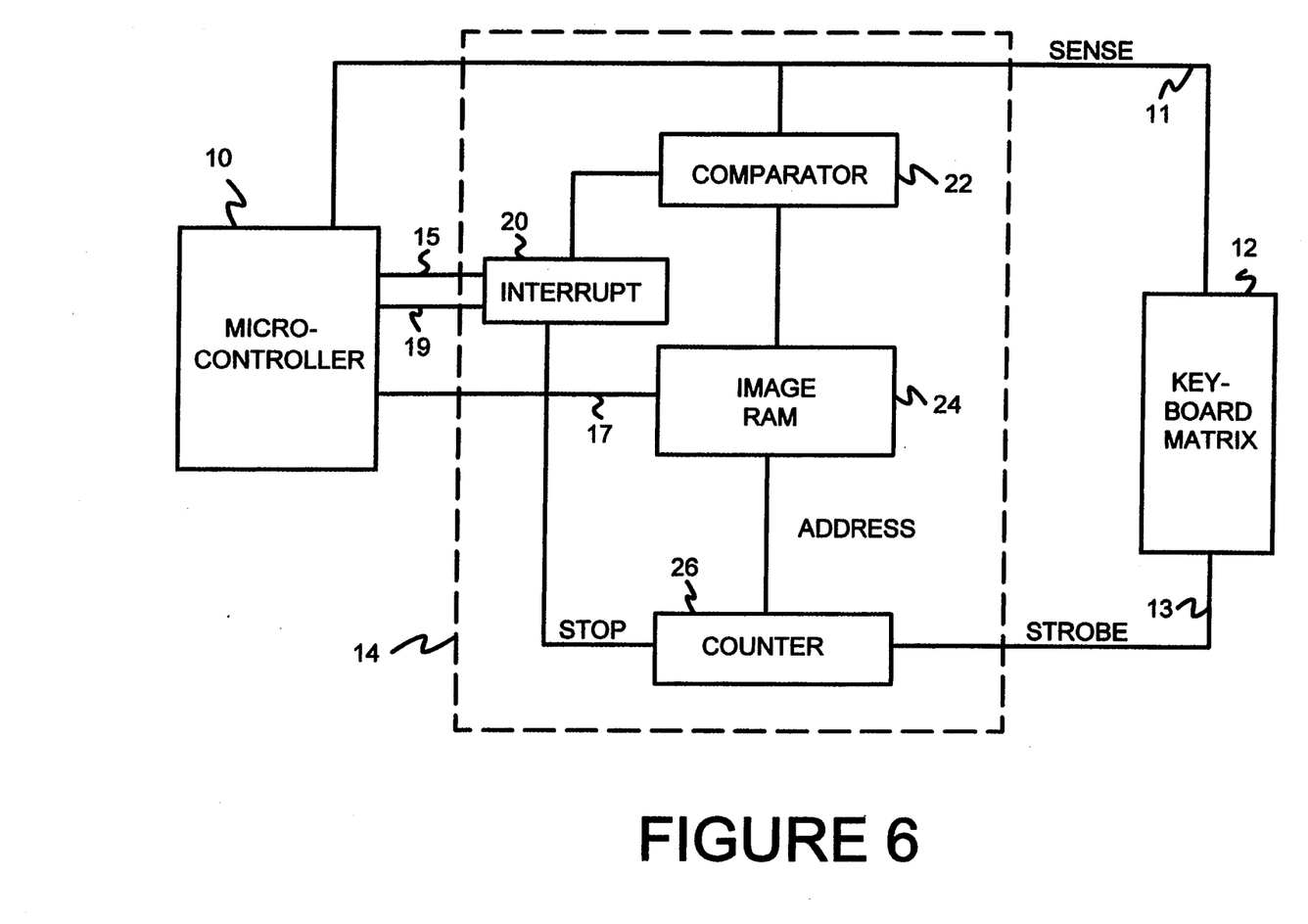
FIG. 6 is a block diagram of the logic circuit described and shown in FIG. 5.

To more fully describe the operation of the logic circuit 14, refer now to FIG. 6, which shows a more detailed embodiment. The logic circuit 14 comprises a comparator 22 which is coupled to a random access memory (RAM) 24 which is further coupled to a counter 26. Comparator 22 also provides signals to an interrupt circuit 20 which in this embodiment is preferably a flip-flop.

As is also seen, the interrupt circuit 20 sends an interrupt signal to the microcontroller 10 and receives an acknowledge signal via line 19 from the microcontroller 10. Furthermore, the microcontroller 10 is coupled to the RAM 24 via line 17 and updates data and address information within the RAM 24. Finally, as is seen, the comparator 22 receives sense signals from the keyboard 12 via line 11. The sense signals are also supplied to the microcontroller 10 at appropriate times. Finally, the counter 26 also provides a strobe signal to the keyboard 12 via line 13.

The logic circuit 14 operates in the following manner. Typically, there is initially a data pattern of key closures in the RAM 24. In this embodiment, the RAM 24 is organized as 16 bytes of data, with their corresponding addresses. Each data byte corresponds to a row of sense lines and each RAM address corresponds to one of the columns or strobe lines. The data pattern initially in the RAM 24 would be "FF" in hexadecimal code indicating that all the sense lines are pulled high and therefore none of the key switches are activated.

The scanning process is controlled by the counter 26, which in this embodiment is a four-bit counter. The counter 26 provides address signals to the RAM 24 and asserts a strobe line on the keyboard 12. Every time the counter 26 increments, a new strobe line is asserted and the next sequential data byte is referenced.

The data byte from the image RAM 24 is then compared with the corresponding sense line state of the keyboard 12 by the comparator 22 to determine whether there has been at least one key switch closure change on the keyboard 12 since the last scan cycle. An interrupt signal is provided to the microcontroller 10 by the interrupt circuit 20 for all data miscompares due to any key switch activity. The interrupt signal also stops the counter 26, thereby freezing the image RAM address and allowing the microcontroller 10 to read the sense line data and update the RAM 24 data. When the interrupt is acknowledged by the microcontroller 10, the counter 26 is released by the microcontroller 10 to continue the scan cycle.

This logic circuit 14 thereby provides for a hardware assist to the keyboard scanning that removes this function from the microcontroller control. In so doing, the valuable processing bandwidth of the microcontroller is not utilized for this function and, therefore, the microcontroller 10 is free to perform other tasks during the times that the keyboard 12 is not active.

Figure 7:
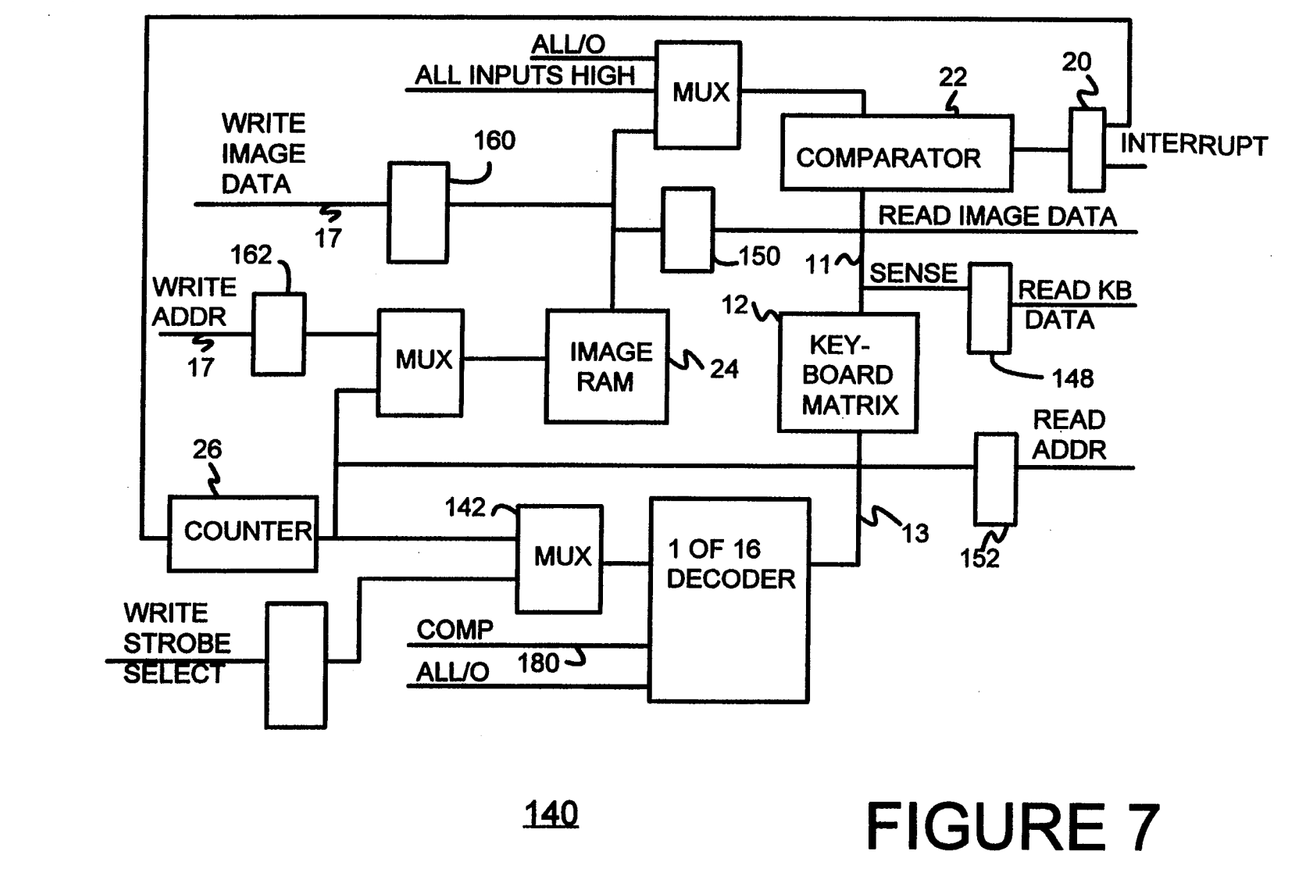
FIG. 7 is a diagram of the preferred embodiment of the present invention.

Referring now to FIG. 7, FIG. 7 shows a block diagram of the preferred embodiment of a logic circuit 140 utilized for the keyboard scanning function. The logic circuit 140 comprises many of the same elements as described in logic circuit 14 of FIG. 3, that is, it includes the image RAM 24, the counter 26 and the comparator 22 and the interrupt circuit 20. These devices operate in basically the same way as above described in FIG. 4.

A first multiplexer 142 is coupled to the output of the counter 26 and provides signals to a decoder 144. The decoder 144 outputs one of sixteen strobe signals to the keyboard 12 dependent upon which number the counter 26 is on. Registers 150 and 152 allow for reading data bytes and address information from RAM 24.

Data bytes are read from the keyboard matrix 12 through register 148 by the microcontroller. A multiplexer 154 is provided between the comparator 22 and the RAM 24 to provide the data to the comparator 22 at the proper time. Multiplexer 154 is used to provide the "FF" pattern for the comparator when no keys are pressed.

There is a signal provided to the decoder 144 and the multiplexer 154 called ALLO. This signal is asserted once there are no key switch closures on the keyboard 12. The ALLO signal is initiated from the microcontroller 10 when the data in the RAM 24 is all "FF". When ALLO is asserted, all the strobe lines 13 go low and the counter 26 is stopped.

As long as there are no keyboard closures, the logic circuit 140 will be inactive. Once keyboard activity occurs, an interrupt from flip-flop 20 will cause the microcontroller to release the ALLO signal. Circuit 140 will operate in the manner as before described. Hence, this embodiment has all the above mentioned advantages of a logic circuit 14 of FIG. 4, namely, lower power consumption and allowing the microcontroller to perform other activities. In addition, logic circuit 140 includes this additional power down capability in which the circuit will dissipate no power during those times of no keyboard activity.

De-ghosting is the process of validating the row data to ensure that each detected key switch closure is caused by the corresponding key switch and not by a combination of unrelated key switch closures. De-ghosting in this embodiment involves comparing the key switch closure data pattern of the current row with the key switch closure data pattern of each and every row to determine if there are any key switch closures which occupy the same position within the row data (for example, two rows which have key closures in position R1). If common data patterns are present, ghost closures may exist and the corresponding row data must be discarded as invalid.

In this embodiment, a signal is provided to decoder 144 called COMP via line 180 which is used to accelerate the process of collecting the data from each and every row. When COMP is asserted, the decoder 144 outputs are complemented. This will assert all column strobes except the strobe associated with the current row.

When this action occurs, the sense lines reflect the logical "or" of all the rows except the current row. The sense line data can be read by the microcontroller 10 via buffer 148 and compared to the current row data to determine if common key closures exist. Normally, this process is done under program control, one row at a time.

It is understood that the above described embodiments are illustrative of but a small number of the many possible specific embodiments which can represent application of the principles of the present invention. Numerous and various other arrangements can be readily devised in accordance with these principles by one of ordinary skill in the art without departing from the spirit and scope of the present invention. The scope of the present invention is limited only by the following claims.

We claim:

1. In combination with a personal computer, the personal computer including a microcontroller and a keyboard including a plurality of key switches, the keyboard further including a plurality of intersecting strobe lines and sense lines, a key switch connected between appropriate strobe and sense lines, a key closure indicating a strobe line is electrically connected to a sense line, a hardware assisted keyboard scanner comprising:

random access memory (RAM) means, the RAM means being organized as a plurality of bytes of data and a plurality of corresponding addresses, each of the plurality of bytes of data corresponds to one of the plurality of sense lines and each of the plurality of addresses corresponds to one of the plurality of strobe lines, the RAM means storing a data pattern of key closures;

counter means coupled to the RAM means for providing an address to the RAM means, the counter means also for sequentially incrementing and asserting each of the strobe lines, each time the counter means increments a strobe line, a new strobe line is asserted and a next sequential data byte is referenced;

comparator means responsive to the counter means for comparing each data byte stored in the RAM means to a corresponding sense line state to determine if there has been at least one key closure change, a miscompare indicating that at least one key closure has changed as a result of key switch activity; and flip-flop means responsive to the comparator means for providing an interrupt signal to and receiving an acknowledge signal from the microcontroller if there has been any key switch activity; the microcontroller updating the RAM means responsive to the interrupt signal means for complementing all strobe lines except the strobe line that is asserted and for providing a signal to the microcontroller to indicate if a common key switch closure exists.

2. The scanner of claim 1 further comprising means responsive to the acknowledge signal from the microcontroller for restarting the counter means.

3. A keyboard scanning assist system for use with a personal computer, the personal computer including a microcontroller and a keyboard, the microcontroller responsive to an interrupt signal for ensuring that keyboard activity is acted upon, the assist system comprising:

a logic circuit means for determining that keyboard activity has taken place which further comprises, random access memory (RAM) means, the RAM means being organized as a plurality of bytes of data and a plurality of corresponding addresses, each of the plurality of bytes of data corresponds to one of the plurality of sense lines and each of the plurality of addresses corresponds to one of the plurality of one strobe lines, the RAM means storing a data pattern of key closures;

counter means for providing an address to the RAM means, the counter means also for sequentially incrementing and asserting each of the strobe lines, each time the counter means increments a strobe line, a new strobe line is asserted and a next sequential data byte is referenced;

comparator means responsive to the counter means for comparing each data byte stored in the RAM means to a corresponding sense line state to determine if there has been at least one key closure change, a miscompare indicating that at least one key closure has changed as a result of key switch activity; and flip-flop means for providing an interrupt signal to and receiving an acknowledge signal from the microcontroller if any key switch has been pressed or released; the microcontroller updating the RAM means responsive to the interrupt signal means for complementing all strobe lines except the strobe line that is asserted and for providing a signal to the microcontroller to indicate if a common key switch closure exists.

4. The assist system of claim 3 further comprising:

means for stopping the counter means when no keyboard activity is detected, wherein no power is dissipated by the hardware assisted keyboard scanner.

5. In combination with a personal computer, the personal computer including a microcontroller and a keyboard including a plurality of key switches, the keyboard further including a plurality of intersecting strobe lines and sense lines, a key switch connected between appropriate strobe and sense lines, a key closure electrically connecting a strobe line to a sense line, a hardware assisted keyboard scanner comprising:

random access memory (RAM) means, the RAM means being organized as a plurality of bytes of data and a plurality of corresponding addresses, each of the plurality of bytes of data corresponds to one of the plurality of sense lines and each of the plurality of addresses corresponds to one of the plurality of strobe lines, the RAM means storing a data pattern of key closures;

counter means for providing an address to the RAM means;

decoder means coupled to the counter means for sequentially incrementing and asserting each of the strobe lines, each time the decoder means increments a strobe line, a new strobe line is asserted and a next sequential data byte is referenced;

comparator means responsive to the counter means for comparing each data byte stored in the RAM means to a corresponding sense line state to determine if there has been at least one key closure change, a miscompare indicating that at least one key closure has changed as a result of key switch activity;

flip-flop means responsive to the comparator means for providing an interrupt signal to and receiving an acknowledge signal from the microcontroller if any key switch has been pressed or released; the microcontroller updating the RAM means responsive to the interrupt signal; and means for complementing all strobe lines except the strobe line that is asserted and for providing a signal to the microcontroller to indicate if a common key switch closure exists.

* * * * *